United States Patent
Lefley (10) Patent No.: US 8,965,279 B2
(45) Date of Patent: Feb. 24, 2015

(54) RECOVERING DATA IN A NEAR FIELD COMMUNICATIONS APPARATUS

(75) Inventor: Alastair Lefley, Kemble (GB)

(73) Assignee: Broadcom Europe Limited, Cambridge (GB)

( * ) Notice: Subject to any disclaimer, the term of this patent is extended or adjusted under 35 U.S.C. 154(b) by 202 days.

(21) Appl. No.: 13/255,937

(22) PCT Filed: Mar. 19, 2010

(86) PCT No.: PCT/GB2010/050471
§ 371 (c)(1),
(2), (4) Date: Sep. 12, 2011

(87) PCT Pub. No.: WO2010/106374
PCT Pub. Date: Sep. 23, 2010

(65) Prior Publication Data
US 2012/0003930 A1    Jan. 5, 2012

(30) Foreign Application Priority Data

Mar. 20, 2009    (GB) .................................. 0904824.0

(51) Int. Cl.
*H04B 5/00*    (2006.01)
*H04B 5/02*    (2006.01)
(Continued)

(52) U.S. Cl.
CPC ............... *H04B 5/02* (2013.01); *G06K 7/0008* (2013.01); *G06K 7/10237* (2013.01); *G11C 5/142* (2013.01); *H04B 5/0081* (2013.01)
USPC ........ 455/41.1; 455/41.2; 340/10.1; 340/10.4

(58) Field of Classification Search
CPC ............ G06K 7/0008; G06K 7/10108; G06K 19/0701; G06K 19/0715; G06K 19/0726; H04B 5/0012; H04B 5/0093; H04B 5/0062; H04B 5/0081; H04B 5/00; H04B 5/0087
USPC ............... 455/41.1–41.3, 106, 208, 121, 558, 455/127.1, 426.1, 560, 567, 569.1; 340/10.1, 572.1, 572.5, 10.52, 10.34, 340/10.51, 12.51, 10.3–10.5, 10.41, 12.23, 340/13.21, 5.25, 12.5, 13.24, 13.31, 5.71, 340/425.5, 438, 442–445, 457.1, 551, 552, 340/566, 568.1, 7.33, 7.35, 7.54, 870.17, 340/906, 815.76

See application file for complete search history.

(56) References Cited

U.S. PATENT DOCUMENTS 5,866,891 A * 2/1999 Fujimoto et al. .............. 235/435
6,028,503 A * 2/2000 Preishuberpflugl et al. . 340/10.4
(Continued)

FOREIGN PATENT DOCUMENTS

DE    10229459 C1    11/2003
EP    0525642        2/1993
(Continued)

OTHER PUBLICATIONS

International Search Report for International Application No. PCT/GB2010/050471, European Patent Office, Netherlands, mailed on Aug. 17, 2010.

(Continued)

*Primary Examiner* — Golam Sorowar
(74) *Attorney, Agent, or Firm* — Sterne, Kessler, Goldstein & Fox P.L.L.C.

(57) ABSTRACT

A communications device is disclosed that includes an antenna circuit with coupling connections that are used interchangeably as a receive coupling connection and a transmit coupling connection for an RF signal. A driver maintains a constant voltage or a constant current on a first coupling connection of the antenna circuit based on a drive signal that includes an output voltage and an output current. A demodulator extracts modulation from the RF signal based on a fluctuating voltage or a fluctuating current on a second coupling connection of the antenna circuit.

15 Claims, 5 Drawing Sheets

(51) Int. Cl.
*G06K 7/00* (2006.01)
*G06K 7/10* (2006.01)
*G11C 5/14* (2006.01)

(56) References Cited

U.S. PATENT DOCUMENTS

| | | | |
|---|---|---|---|
| 6,272,320 | B1 | 8/2001 | Nandra et al. |
| 6,982,627 | B2 | 1/2006 | Oberhuber et al. |
| 2001/0000659 | A1 | 5/2001 | Hayashi et al. |
| 2003/0124996 | A1* | 7/2003 | Amiot et al. .......... 455/131 |
| 2004/0046674 | A1* | 3/2004 | Andrews et al. ....... 340/657 |
| 2005/0176381 | A1* | 8/2005 | Ieki et al. ............... 455/78 |
| 2007/0274242 | A1* | 11/2007 | Lamacraft et al. ..... 370/310 |
| 2008/0246667 | A1* | 10/2008 | Symons ................. 343/702 |
| 2008/0272889 | A1 | 11/2008 | Symons |

FOREIGN PATENT DOCUMENTS

| | | | | |
|---|---|---|---|---|
| EP | 525642 | * | 2/1993 | ......... G06K 19/07 |
| EP | 0722155 | A1 | 7/1996 | |
| EP | 1486903 | * | 12/2004 | ......... G06K 7/00 |
| EP | 1486903 | A2 | 12/2004 | |
| GB | 2198014 | A | 6/1988 | |
| GB | 2444179 | A | 5/2008 | |
| WO | WO 2006/095186 | A1 | 9/2006 | |
| WO | WO 2006/123170 | | 11/2006 | |
| WO | WO 2006123170 | A1 * | 11/2006 | ......... G06K 7/00 |
| WO | WO 2008/117029 | | 2/2008 | |
| WO | WO 2008/033006 | A1 | 3/2008 | |
| WO | WO 2008071925 | A1 * | 6/2008 | ......... H04B 5/02 |

OTHER PUBLICATIONS

Written Opinion directed toward International Application No. PCT/GB2010/050471, United States Patent and Trademark Office, United States, mailed on Sep. 20, 2011.

International Standard: ISO/IEC 21481, *Information technology—Telecommunications and information exchange between systems—Near Field Communication Interface and Protocol—2(NFCIP-2)*, pp. 1-12, First edition, Reference No. ISO/IEC 21481:2005(E), ISO/IEC (Jan. 2005).

International Standard: ISO/IEC 18092, *Information technology—Telecommunications and information exchange between systems—Near Field Communication—Interface and Protocol (NFCIP-1)*, pp. 1-66, First edition, Reference No. ISO/IEC 18092:2004(E), ISO/IEC (Apr. 2004).

International Standard: ISO/IEC 14443, *Identification cards—Contactless integrated circuit cards—Proximity cards, Part 4: Transmission protocol*, pp. 1-46, Second edition, Reference No. ISO/IEC 14443-4:2008(E), ISO/IEC (Jul. 2008).

International Standard: ISO/IEC 15693, *Identification cards—Contactless integrated circuit cards—Vicinity cards—Part 3: Anticollision and transmission protocol*, pp. 1-51, First edition, Reference No. ISO/I EC 15693-3:2001 (E), ISO/IEC (Apr. 2001).

Office Action for British Patent Application No. GB0904824.0, dated Jun. 3, 2011, 2 pages.

* cited by examiner

RECOVERING DATA IN A NEAR FIELD COMMUNICATIONS APPARATUS

CROSS-REFERENCE TO RELATED APPLICATIONS

This application is a National Stage of International Application No. PCT/GB2010/050471, filed on Mar. 19, 2010, which claims the benefit of Great Britain Patent Application No. 0904824.0, filed on Mar. 20, 2009.

This invention relates to near field RF communications apparatus and to near field RF communicators and near field communications enabled devices.

Near field RF (radio frequency) communication is becoming more and more commonplace as is the use of such technology to transfer data. Near field RF communicators communicate through the modulation of the magnetic field (H field) generated by a radio frequency antenna. Near field RF communication thus requires an antenna of one near field RF communicator to be present within the alternating magnetic field (H field) generated by the antenna of another near field RF communicator by transmission of an RF signal (for example a 13.56 Mega Hertz signal) to enable the magnetic field (H field) of the RF signal to be inductively coupled between the communicators. The RF signal may be modulated to enable communication of control and/or other data. Ranges of up to several centimeters (generally a maximum of 1 meter) are common for near field RF communicators.

NFC communicators are a type of near field RF communicator that is capable in an initiator mode of initiating a near field RF communication (through transmission or generation of an alternating magnetic field) with another near field RF communicator and is capable in a target mode of responding to initiation of a near field RF communication by another near field RF communicator. The term "near field RF communicator" includes not only NFC communicators but also initiator near field RF communicators such as RFID transceivers or readers that are capable of initiating a near field RF communication but not responding to initiation of a near field RF communication by another near field RF communicator and target or responding near field RF communicators such as RFID transponders or tags that are capable of responding to initiation of a near field RF communication by another near field RF communicator but not of initiating a near field RF communication with another near field RF communicator. Hence NFC communicators can act as both RFID transceivers and RFID transponders and are able to communicate with other NFC communicators, RFID transceivers and RFID transponders.

In addition NFC communicators may be associated with or comprised within or attached to certain peripheral devices, for example SIM cards (e.g. UICC), Secure Elements, memory devices (for example MCU, RAM, ROM and non-volatile memory), display driver or other drivers. During operation the NFC communicator must also be able to communicate with and transfer data to and from such peripheral device.

There are several standards in existence which set out certain communication protocols and functional requirements for RFID and near field RF communications. Examples are ISO/IEC 14443, ISO 15693, ISO/IEC 18092 and ISO/IEC 21481.

NFC communicators may be comprised within a larger device, NFC communications enabled devices. Examples include mobile telephones, PDAs, computers, smart cards. When comprised within such NFC communications enabled devices the NFC communicator must be able to transfer data to and from the larger device and to and from any peripheral devices (including interface systems, such as the single wire protocol) associated with such larger device.

There is pressure to reduce the space or real-estate occupied by near field RF communications apparatus (that is the near field RF communicator without the antenna circuit), particularly where the near field RF communicator is an NFC communicator and the near field RF communications apparatus is to be embedded, or otherwise incorporated, for example as an integrated circuit, in a third party host device such as a mobile telephone (cellphone) or PDA where the overall real estate or space within the host device is already small and the space available for the near field RF communications apparatus is limited.

An aspect of the present invention provides near field RF communications apparatus that alleviates at least some of the aforementioned problems.

An aspect of the present invention provides near field RF communications apparatus as out in claim 1.

In an aspect there is provided a near field RF communications apparatus having: a driver to provide an RF drive signal to drive an inductive coupler arranged to couple via the H-field with another inductive coupler, the RF drive signal having an RF output voltage and an RF output current; and a demodulator to extract modulation from an RF signal inductively coupled to the inductive coupler of the near field RF communications apparatus, the driver being arranged to maintain one of the RF output current and the RF output voltage substantially constant such that variations in the antenna loading of the near field RF communications apparatus do not substantially vary the one of the RF output current and the RF output voltage to enable the demodulator to extract modulation from an RF signal on the basis of variation in the other of the RF output current and the RF output voltage.

The present invention also provides a near field RF communicator having such near field communications apparatus and the inductive coupler.

Embodiments of the present invention enable the size of or real-estate occupied by a near field RF communications apparatus to be reduced by enabling the transmit coupling connection or connections also to be used as the receive coupling connection or connections. This reduces the total number of coupling connections, including transmit and receive coupling connections, required by the near field RF communications apparatus. Reducing the total number of coupling connections enables the near field RF communications apparatus to be made smaller whilst still complying with minimum spacing design constraints for coupling connections (pins in the case where the near field RF communications apparatus comprises an integrated circuit). Enabling the transmit coupling connection or connections also to be used as the receive coupling connection or connections also reduces the number of external components required where the near field RF communications apparatus comprises an integrated circuit.

Embodiments of the present invention enable the transmit coupling connection or connections also to be used as the receive coupling connection or connections by maintaining one of the output voltage and output current supplied to the transmit coupling connection or connections constant and detecting load modulation on the basis of variation of the other of the output voltage and output current supplied to the transmit coupling connection or connections, thereby reducing the total number of coupling connections required by the near field RF communications apparatus and so reducing real-estate requirements and reducing the number of external components as discussed above.

Embodiments of the present invention provide near field communications apparatus comprising a driver that provides a drive signal having an output voltage and an output current to drive an inductive coupler, generally an antenna circuit, of a near field RF communicator such as an NFC communicator, and a demodulator that extracts modulation from an RF signal coupled to the inductive coupler. The driver is arranged to maintain one of the output current and the output voltage substantially constant to enable the demodulator to extract modulation from an RF signal on the basis of variation in the other of the output current and the output voltage.

Embodiments of the present invention will now be described, by way of example, with reference to the accompanying drawings, in which.

With reference to the drawings in general, it should be understood that any functional block diagrams are intended simply to show the functionality that exists within the device and should not be taken to imply that each block shown in the functional block diagram is necessarily a discrete or separate entity. The functionality provided by a block may be discrete or may be dispersed throughout the device or throughout a part of the device. In addition, the functionality may incorporate, where appropriate, hard-wired elements, software elements or firmware elements or any combination of these. The near field RF communicator may be provided wholly or partially as an integrated circuit or collection(s) of integrated circuits.

Figure 1:
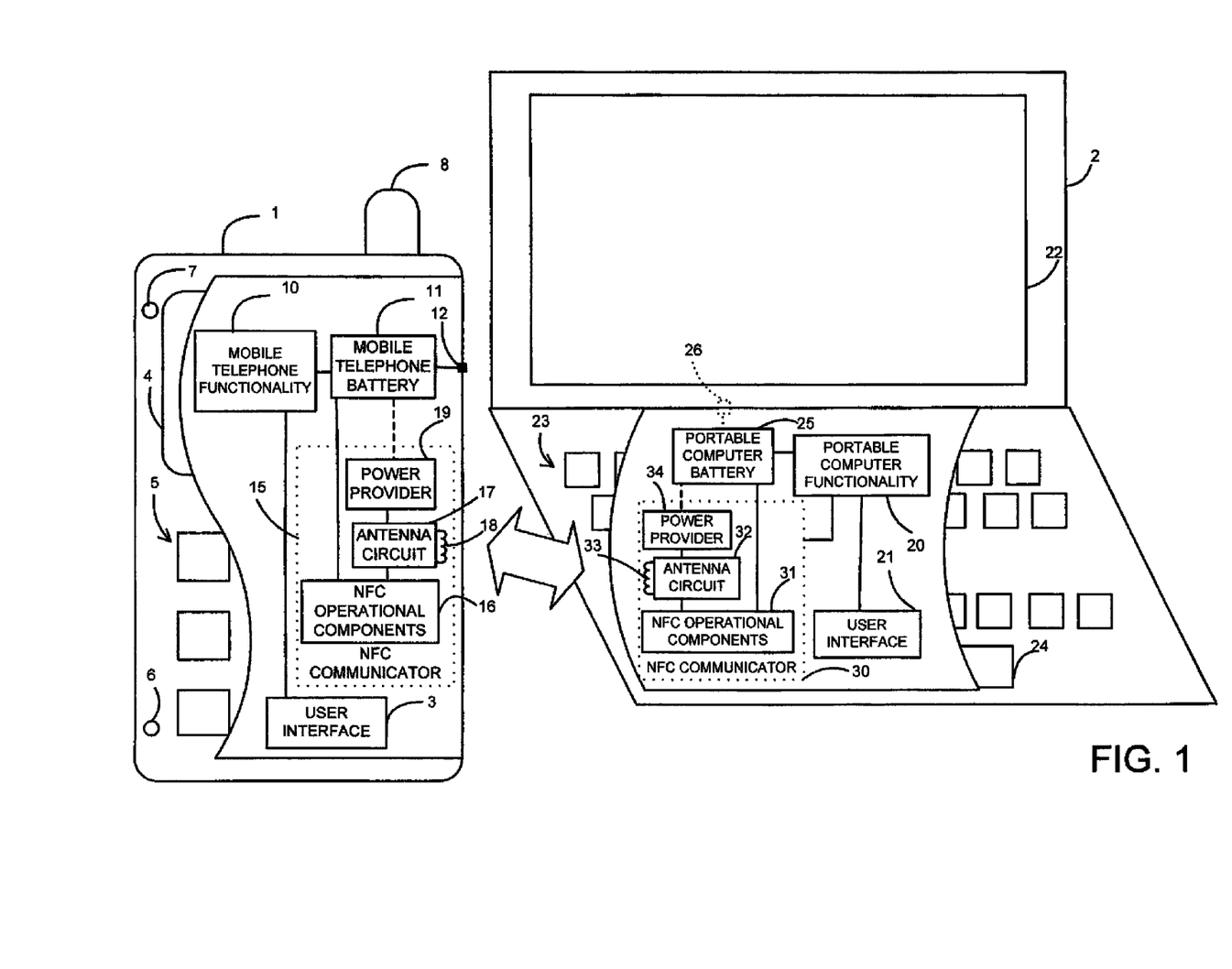
FIG. 1 shows a representational diagram illustrating communication between two devices comprising NFC communicators.

Referring now specifically to FIG. 1, there is shown a representational diagram illustrating communication between two NFC communications enabled devices. In FIG. 1 the representations of the NFC communications enabled devices have been shown partly cut-away and the functionality provided by the NFC communications enabled devices illustrated by way of a functional block diagram within the NFC communications enabled device.

As shown in FIG. 1, one NFC communications enabled device comprises a mobile telephone (cellphone) 1 and the other NFC communications enabled device comprises a portable computer 2 such as a notebook or laptop computer.

The mobile telephone 1 has the usual features of a mobile telephone including mobile telephone functionality 10 (in the form of, usually, a programmed controller, generally a processor or microprocessor with associated memory or data storage, for controlling operation of the mobile telephone in combination with a SIM card), an antenna 8 for enabling connection to a mobile telecommunications network, and a user interface 3 with a display 4, a keypad 5, a microphone 6 for receiving user voice input and a loudspeaker 7 for outputting received audio to the user. The mobile telephone also has a chargeable battery 11 coupled to a charging socket 12 via which a mains adapter (not shown) may be connected to enable charging of the battery 11. The mobile telephone 1 may have an alternative or additional power supply (not shown), for example a reserve battery or emergency battery. The chargeable battery 11 forms the primary power supply for the mobile telephone and NFC communicator 15. Given it is chargeable, it is designed to be removed at certain times.

Similarly the portable computer 2 has the usual features of a portable computer including portable computer functionality 20 in the form of, usually, a processor with associated memory in the form of ROM, RAM and/or hard disk drive, one or more removable media drives such as a floppy disk drive and/or a CDROM or DVD drive, and possibly a communications device for enabling the portable computer to connect to a network such as the Internet. The portable computer 2 also includes a user interface 21 including a display 22, a keyboard 23 and a pointing device, as shown a touchpad 24. The portable computer 2 also has a chargeable battery 25 coupled to a charging socket 26 via which a mains adapter (not shown) may be connected to enable charging of the battery 25. Again the chargeable battery 25 is the primary power supply for the portable computer and NFC communicator 30.

In addition, as shown in FIG. 1, both NFC communications enabled devices 1 and 2 have an NFC communicator 15 and 30. As shown, the NFC communicators 15 and 30 are incorporated within the larger devices and, as with the other functional blocks, may be discrete entities within the host devices or may be provided by features dispersed throughout or integrated within the host device or a part of the host device.

Each NFC communicator 15 and 30 comprises NFC operational components 16 and 31 for, as will be described below, enabling control of the NFC functionality and generation, modulation and demodulation of an RF signal. The functionality of the NFC communicator excluding the antenna circuit 102 and the power provider 104 is also referred to herein as the NFC communications apparatus.

Each NFC communicator 15 and 30 also comprises an antenna circuit 17 and 32 comprising an inductor or coil in the form of an antenna 18 and 33. The antenna circuits 17 and 32 enable an alternating magnetic field (H field) generated by the antenna of one near field RF communicator 15 (or 30) by transmission of an RF signal (for example a 13.56 Mega Hertz signal) to be inductively coupled to the antenna of the other near field RF communicator 30 (or 15) when that antenna is within the near field of the RF signal generated by the one near field RF communicator 15 (or 30).

The NFC communicators 15 and 30 are coupled to the mobile telephone and portable computer functionality 10 and 20, respectively, to enable data and/or control commands to be sent between the NFC communicator and the host device and to enable user input to the NFC communicator. Communication between the user interface 3 or 21 and the NFC communicator 15 or 30 is via the host device functionality 11 or 20, respectively.

Each NFC communicator 15 and 30 also comprises a power provider 19 and 34. The power providers 19 and 34 may be power supplies within the host device or specific to the NFC communicators 15 and 30, for example a button cell battery, or other small battery. In this case as shown by dashed lines in FIG. 1, one or both of the power providers 19 and 34 comprise a coupling to derive power from the corresponding device battery 11 or 25 i.e. the primary power supply.

It will be appreciated that FIG. 1 shows only examples of types of host devices. A host device may be another type of electrical device such as a personal digital assistant (PDA), other portable electrical device such as a portable audio and/or or video player such as an MP3 player, an IPOD®, CD player, DVD player or other electrical device. As another possibility the NFC communicator (15 or 3) may be comprised within or coupled to a peripheral device, for example in the form of a smart card or other secure element which may be stand alone or comprised within or intended to be inserted into another electrical device. For example a SIM card for use in a mobile telephone. As a further possibility such peripheral devices may comprise interfacing systems or protocols such as the single wire protocol.

Also, rather than being incorporated within the host device, the NFC communicator 15 or 30 may be associated with the host device, for example by a wired or wireless coupling. In such a case, a housing of the NFC communicator may be physically separate from or may be attached to the housing of the host device; in the later case, the attachment may be permanent once made or the NFC communicator may be removable. For example, the NFC communicator may be housed within: a housing attachable to another device; a housing portion, such as a fascia of the NFC communications enabled device or another device; an access card; or may have a housing shaped or configured to look like a smart card. For example an NFC communicator may be coupled to a larger device by way of a communications link such as, for example, a USB link, or may be provided as a card (for example a PCMCIA card or a card that looks like a smart card) which can be received in an appropriate slot of the larger or host device.

In addition, one or both of the NFC communications enabled devices may be a standalone NFC communicator, that is it may have no functionality beyond its NFC communications functionality.

Figure 2:
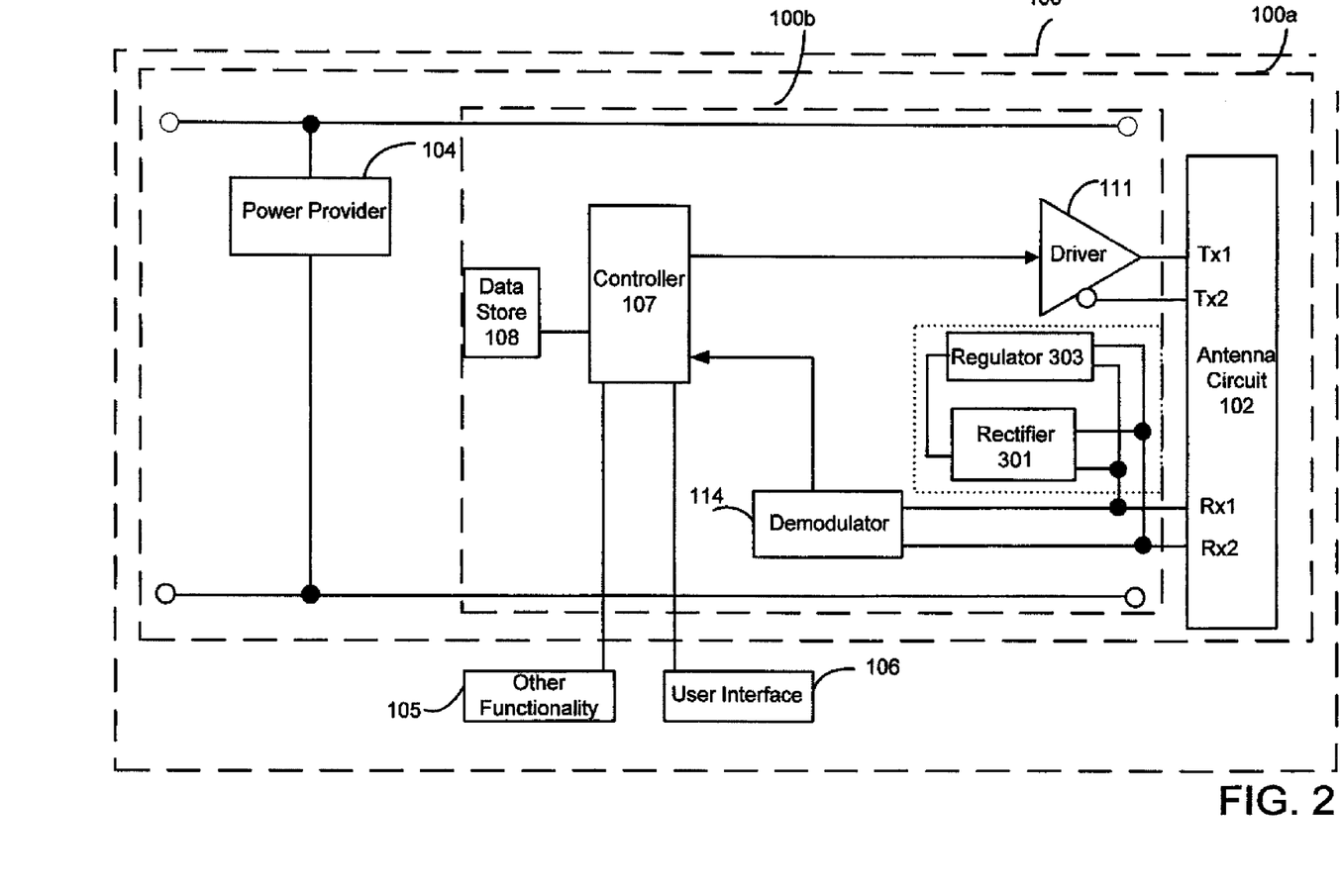
FIG. 2 shows a functional block diagram of a NFC communicator comprising NFC communications apparatus and an antenna circuit.

FIG. 2 shows a functional block diagram of an example of an NFC communications enabled device 100 to illustrate in greater detail one way in which an NFC communicator may be implemented.

In this example, the NFC communications enabled device 100 comprises an NFC communicator 100a including an antenna circuit 102, power provider 104 and NFC operational components or NFC communications apparatus 100b.

The power provider 104 may be any one or more of the types of power providers discussed above. In the interests of simplicity, power supply couplings from the power provider 104 to other components are not shown in FIG. 2.

The NFC communications enabled device 100 may or may not also have or be capable of being connected or coupled with at least one of other functionality 105 (for example functionality of a host device or peripheral device such as described above) and a user interface 106.

The NFC operational components include a controller 107 to controls overall operation of the NFC communicator. The controller 107 is coupled to a data store 108 for storing data (information and/or control data) to be transmitted from and/or data received by the NFC communications enabled device. The controller 107 may be a microprocessor, for example a RISC processor or other microprocessor or a state machine. Program instructions for programming the controller and/or control data for communication to another near field RF communicator may be stored in an internal memory of the controller and/or the data store.

The NFC operational components also include a demodulator 114 coupled between the antenna circuit 102 and the controller 107 for demodulating a modulated RF signal inductively coupled to the antenna circuit 102 from another near field RF communicator in near field range and for supplying the thus-extracted data to the controller 107 for processing. The demodulator may be an IQ demodulator as described in WO2006/123170, the whole contents of which are hereby incorporated by reference, or any other suitable demodulator. The received signal is also supplied to a rectifier 301 and a regulator 303. The regulator 303 sets the required voltage for the NFC operational components (pin voltage in the case of an integrated circuit) and rectifier 301 provides rectified voltage to remainder of the NFC circuit. For simplicity, the couplings to supply the regulated rectified voltage to power the NFC operational components are not shown in FIG. 2. Together the rectifier 301 and regulator 303 protect the NFC operational components from high voltages received at antenna circuit 102. For example the regulator may limit the voltage to 3.3 volts. Any standard regulator and rectification circuit can be used for this. The NFC operational components may also include an amplifier for amplifying an RF signal inductively coupled to the antenna circuit 102. As another possibility, the NFC operational components may be powered solely by the power provider 104.

In addition the NFC operational components include functionality for enabling modulation of an RF signal to enable data to be communicated to another near field RF communicator in near field range of the NFC communicator 100a. As shown in FIG. 2, this functionality is provided by a controller 107 and a driver 111 coupled to the antenna circuit 102. In some examples, a separate signal generator that operates under the control of the controller 107 may be provided. Modulation is in this example achieved by gating or switching on and off an RF signal in accordance with the data to be communicated. The NFC communicator may use any appropriate modulation scheme that is in accordance with the standards and/or protocols under which the NFC communicator operates. As another possibility a separate or further signal controller may be incorporated within the NFC operational components to control modulation of the signal generated by a signal generator in accordance with data or instructions received from the controller 107.

The NFC communicator 100a may operate in an initiator mode (that is as an initiating near field RF communicator) or a target mode (that is as a responding near field RF communicator), dependent on the mode to which the NFC communicator is set. The mode may be determined by the controller 107 or may be determined in dependence on the nature of a received near field RF signal. When in initiator mode, an NFC communicator initiates communications with any compatible responding near field RF communicator capable of responding to the initiating NFC communicator (for example an NFC communicator in target mode or an RFID tag or transponder) that is in its near field range, while when in target mode an NFC communicator waits for a communication from a compatible initiating near field RF communicator (for example an NFC communicator in initiator mode or an RFID initiator or transceiver). As thus used, compatible means operable at the same frequency and in accordance with the same protocols, for example in accordance with the protocols set out in various standards such as ISO/IEC 18092, ISO/IEC 21481, ISO/IEC 14443 and ISO/IEC 15693. NFC communicators commonly operate at or around 13.56 MHz.

When in initiator or target mode, the NFC communicator may communicate in accordance with an active or passive protocol. When using an active protocol the initiating NFC communicator will transmit an RF field and following completion of its data communication turn off its RF field. The responding near field RF communicator (target) will then transmit its own RF field and data before again turning off the RF field and so on. When using a passive protocol the NFC communicator (initiator) will transmit and maintain its RF field throughout the entire communication sequence. The protocol used will depend on instructions received from the controller 107 and the response received from a responding near field RF communicator.

In FIG. 2 control of operation of the NFC communicator is through controller 107. As another possibility where the NFC communicator is comprised as part of a host device, control of the operation of the NFC communicator may be directed by the host device, for example through other functionality 105. In such circumstances all or part of the control may be provided by the other functionality 105. For example the NFC communicator controller 107 may control modulation and modulation protocols whereas the data to be transmitted may be provided by the other functionality 105.

The NFC communicator also comprises an antenna circuit 102. The design of the antenna circuit will depend on the NFC communicator 100 and the environment in which it operates. The antenna circuit may be a single-ended circuit with one transmit output and one receive input or a double-ended circuit having two transmit outputs and two receive inputs, or may be single-ended for one of receive and transmit and double-ended for the other. FIG. 2 illustrates a double-ended antenna circuit with two transmit outputs Tx1 and Tx2 and two receive inputs Rx1 and Rx2. Generally the functionality except the antenna circuit 102 and the power provider 104 may be provided by one or more integrated circuits and so the transmit outputs Tx1 and Tx2 and receive inputs Rx1 and Rx2 will be provided by pins of the integrated circuit. As an example the antenna circuit may be in one of the forms described for co-pending international patent application publication number WO2008/117029 (NFC Antenna).

Figure 3:
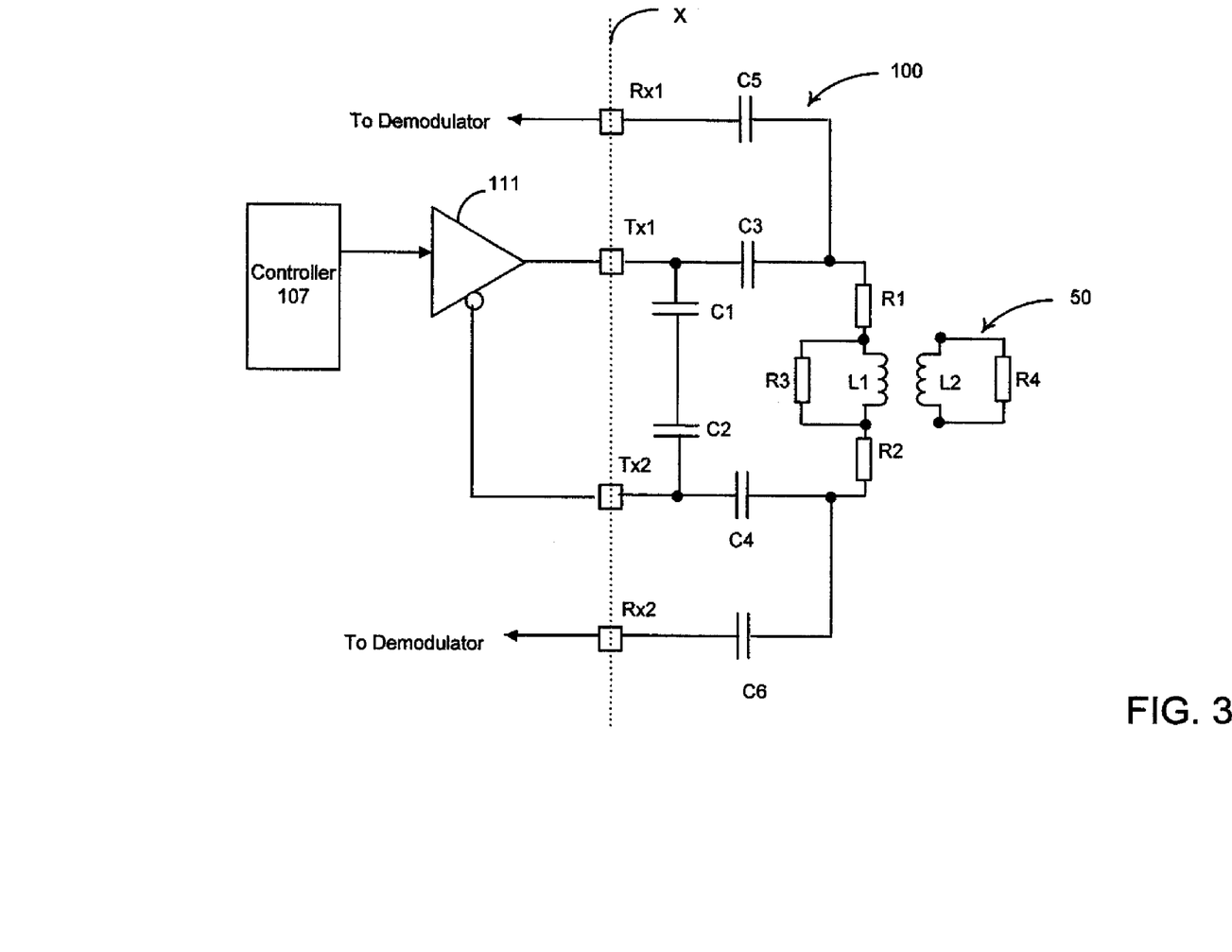
FIG. 3 shows an example of an antenna circuit that may be used in the NFC communicator shown in FIG. 2.

FIG. 3 shows an example of a double-ended antenna circuit that may be used for the NFC communicator 100 shown in FIG. 2. In this example, the antenna circuit comprises an antenna coil L1 (resistor R3 represents the parasitic resistance of the antenna coil L1) with one end of the antenna coil L1 being coupled to transmit pin Tx1 via a resistor R1 and a capacitor C3 and to receive pin Rx1 via a capacitor C5 and the other end of the antenna coil L1 being coupled via a resistor R2 and a capacitor C4 to transmit pin Tx2 and to receive pin Rx2 via a capacitor C6. In the example shown, capacitors C1 and C2 are coupled in series across the transmit pins Tx1 and Tx2. The dashed line X in FIG. 3 illustrates the periphery of the NFC communications apparatus, that it the periphery of the integrated circuit in this example. It will be appreciated that FIG. 3 is only an example and that many different forms of antenna circuit are possible.

Another near field RF communicator 50 (shown for simplicity in FIG. 3 simply as an antenna coil L1 (with its parasitic resistor R4)) having its antenna coil in inductive coupling (H field) range communicates data to the NFC communicator 100 by load modulation that is by causing the load on the antenna circuit of the NFC communicator 100 to vary in accordance with the data to be communicated, thereby effecting amplitude modulation.

The NFC communicator illustrated by FIGS. 2 and 3 requires four coupling connections (pins in the case of an integrated circuit) Tx1, Tx2, Rx1 and Rx2 for the antenna circuit while the NFC communicator as a whole may only require 10 or so coupling connections.

There is a desire to reduce the space or real-estate occupied by an NFC communicator. The real estate required is generally related to number of the coupling connections (pins in the case of an integrated circuit) of the near field communications apparatus because design constraints determine a minimum spacing between coupling connections. The pressure to reduce the space or real-estate occupied by near field communications apparatus is particularly high where the near field communications apparatus is to be embedded, for example as an integrated circuit, in a third party host device such as a mobile telephone (cellphone) or PDA where the overall real estate or space within the host device is already small and the space available for the near field communications apparatus is limited.

Embodiments of the present invention enable the size of the near field communications apparatus to be reduced by reducing the number of coupling connections (pins in the case of an integrated circuit) by enabling the transmit coupling connection or connections also to be used as the receive coupling connection or connections.

Embodiments of the present invention enable also enable a reduction in the number of external components required where the near field RF communications apparatus comprises an integrated circuit.

Embodiments of the present invention enable the transmit coupling connection or connections also to be used as the receive coupling connection or connections by maintaining one of the voltage and current supplied to the transmit coupling connection or connections constant and detecting modulation using the other of the voltage and current supplied to the transmit coupling connection or connections. The output current $I_{out}$ of the antenna circuit is proportional to the ratio of the output voltage $V_{out}$ of the antenna circuit divided by an effective resistance which consists of the output resistance $R_{out}$ of the antenna circuit and the load resistance $R_{load'}$ provided by the load (the antenna circuit of another near field RF communicator, for example a tag):

$$I_{out} \alpha \frac{V_{out}}{R_{out} + R_{load'}}.$$

so that when the output current $I_{out}$ is maintained constant, any load modulation will affect the output voltage $V_{out}$ and so will be detectable from variation of the output voltage $V_{out}$, whereas when the output voltage $V_{out}$ is maintained constant any load modulation will affect the output current $I_{out}$ and so will be detectable from variation of the output current $I_{out}$.

Figure 4:
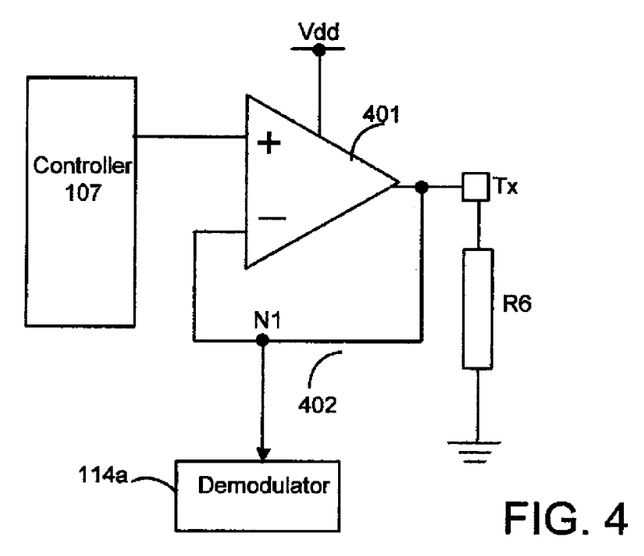
FIGS. 4 and 5 illustrate examples of drivers for providing a constant output voltage for an antenna circuit of NFC communications apparatus embodying the invention.
Figure 5:
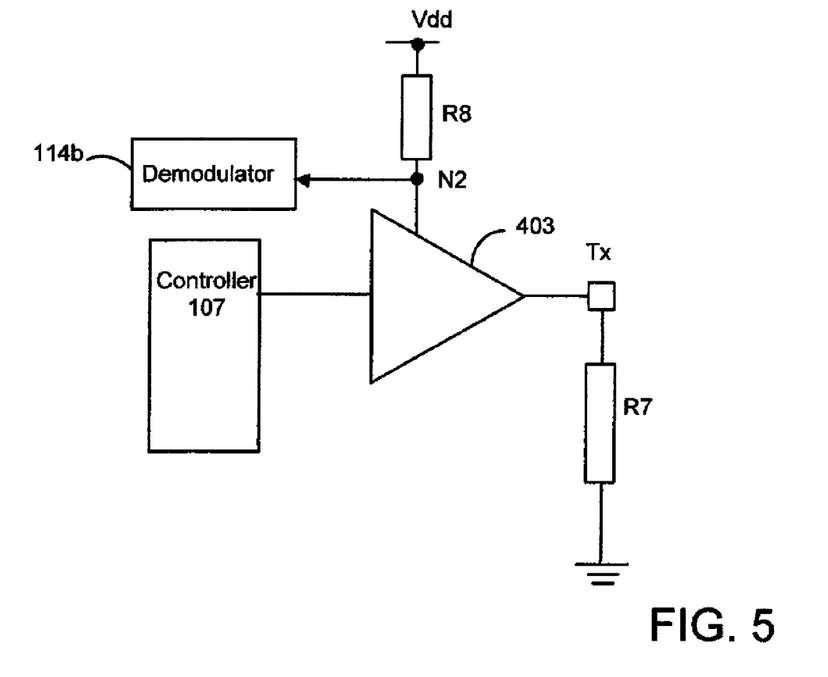
Figure 6:
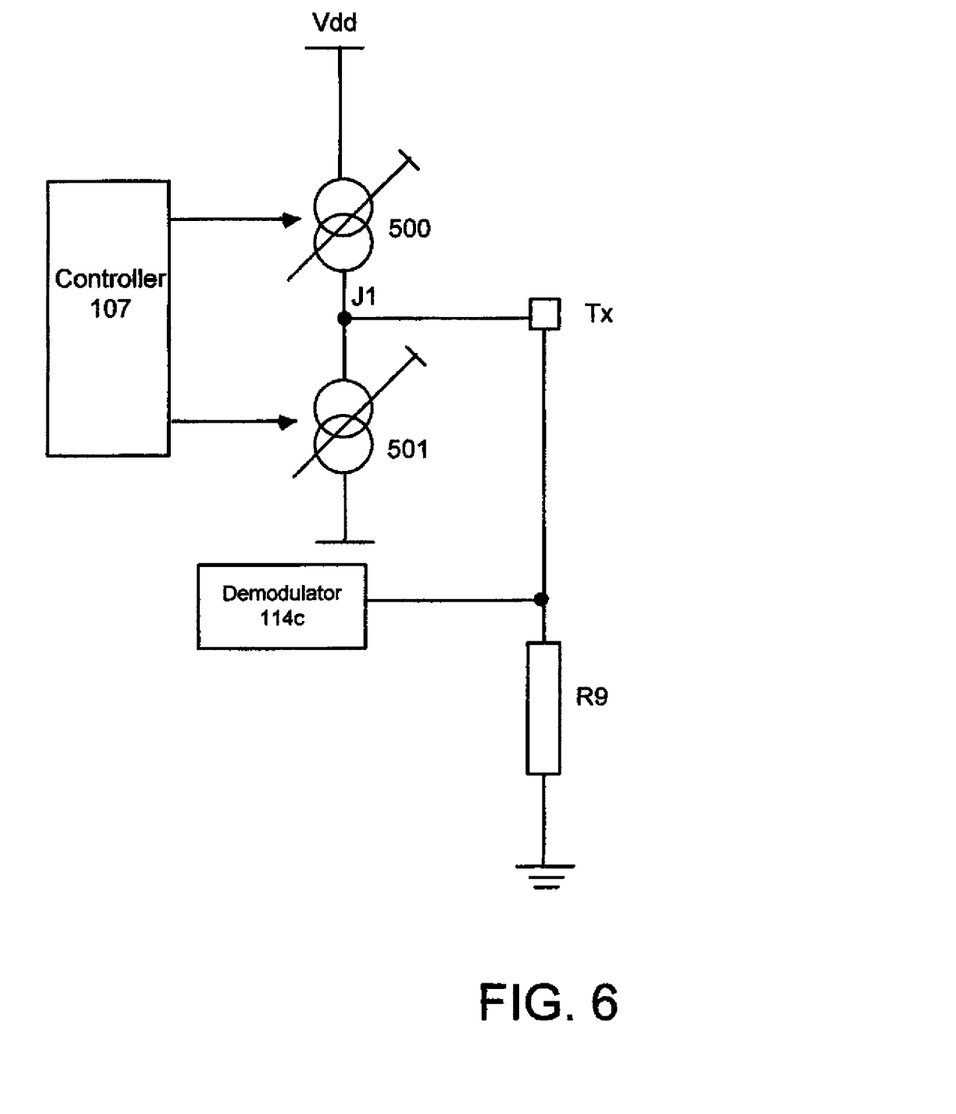
FIG. 6 illustrates an example of a driver for providing a constant output current for an antenna circuit of NFC communications apparatus embodying the invention.

FIGS. 4 to 6 illustrate examples of drivers that may be used in place of the driver 111 shown in FIG. 2 where the antenna circuit is a single-ended antenna circuit. The drivers shown in FIGS. 4 and 5 are arranged to provide a constant output voltage $V_{out}$ for the antenna circuit to enable load modulation to be detected on the basis of variation of the output current $I_{out}$ so that only a single transmit/receive coupling connection Tx/Rx is required. FIG. 6 illustrates an example of a driver that is arranged to provide a constant output current $I_{out}$ for the antenna circuit to enable load modulation to be detected on the basis of variation of the output voltage $V_{out}$. In FIGS. 4 to 6, Vdd represents the power supply line.

In the example shown in FIG. 4, the driver 111 is replaced by a differential amplifier, in this example a class AB amplifier, 401 (although any appropriate form of linear analogue driver may be used) having its positive input coupled to an oscillating signal supply output of the controller 107 (or signal generator if a separate signal generator is provided). The output of the differential amplifier 401 is coupled to its negative input via a feedback path 402 and is also coupled to a single transmit coupling connection or output Tx. In FIG. 4, resistor R6 represents the loading of the antenna. The demodulator 114a is in this example a single input demodulator and is coupled to a feedback node N1 of the feedback path. Any suitable demodulator that is capable of decoding changes in both amplitude and phase resulting from load modulation may be used. In operation, the voltage at the single output Tx is controlled when the NFC communicator is in target mode so that a constant voltage $V_{out}$ is provided at the single output Tx whilst the current through the feedback path 402 and thus at the feedback node N1 varies in accordance with any load modulation enabling the demodulator 114a to extract the modulation from the varying current.

In the example shown in FIG. 5, the driver 111 is replaced by a single input amplifier 403 (which may be of the same type as the amplifier 401 shown in FIG. 4) having its input coupled to an oscillating signal supply output of the controller 107 (or signal generator if a separate signal generator is provided). The output of the amplifier 403 is coupled to a single transmit coupling connection or output Tx. Resistor R7 represents the loading of the antenna. A sense resistor R8 is provided in the amplifier power supply coupling to Vdd and an appropriate single input demodulator 114b is coupled to a node N2. Again any suitable demodulator that is capable of decoding changes in both amplitude and phase resulting from load modulation may be used. In operation, the voltage at the single output Tx is controlled when the NFC communicator is in target mode so that a constant voltage $V_{out}$ is provided whilst the current through the sense resistor R8 varies in accordance with any load modulation enabling the single input demodulator 114b to extract modulation on the basis of variation of the current flowing through the sense resistor R.

In the example shown in FIG. 6, the controller 107 is arranged to provide an oscillating signal, for example by sine synthesis, to two variable current sources 500 and 501 through which the currents are adjusted or controlled when the NFC communicator is in target mode so that the current at a junction J1 between the two variable current sources 500 and 501 remains constant. The junction J1 is coupled to a single transmit coupling connection or output Tx. In this Figure, the resistor R9 represents the loading of the antenna. The transmit coupling connection Tx is coupled to the demodulator 114c. In operation, the current at the single output Tx is controlled when the NFC communicator is in target mode so that a constant current $I_{out}$ is provided whilst the output voltage varies in accordance with any load modulation, enabling the single input demodulator 114c to extract modulation on the basis of variation of the output voltage.

It will be appreciated that other drivers than those described above may be used to enable either the output current or the output voltage to be held constant. It will of course be appreciated that in an NFC communicator the output current and output voltage oscillate. Where reference is made herein to keeping or maintaining a voltage output or a current output constant, it should be understood that what is meant is that the loading on the antenna does not affect it, that is the voltage or current, as the case may be, does not change with the output load resistance. It may be in practice that some variation with load resistance may be acceptable in the constant voltage or constant current, provided that the modulation is still detectable by the demodulator.

The term "load" is used herein to mean antenna loading, i.e. the electrical impedance of an antenna (or inductive coupler) due to inductive loads (impedances) which are inductively coupled to it. The drive signal may be any oscillatory signal and need not be radio frequency, RF. The actual frequency of this oscillatory signal may depend, for example, upon the parameters (tuning) of the inductive couplers.

Although single-ended interfaces and circuits are shown in the examples of FIGS. 4 to 6, it will be appreciated that the invention may be applied where differential interfaces and circuits are used and also where a combination of single-ended and differential interfaces and circuits are used.

It will be appreciated that the above description is directed to the operation of the NFC communicator in target mode and that, when the NFC communicator is in initiator mode, then, in order to allow modulation, the controller will modulate the constant current or voltage, as the case may be, in accordance with the data to be transmitted. It will be appreciated that in the initiator mode when the antenna driver and demodulator are turned on, the rectifier and regulator (FIG. 2) are turned off and in the target mode when the antenna driver and demodulator are turned off, the rectifier and regulator (FIG. 2) are turned on, so that the rectifier and regulator do not interfere with the antenna driver. Thus, in the target mode the regulator and rectifier will behave benignly, that is as though they were not present.

In the above embodiments the invention is described in connection with an NFC communicator. It will be apparent to the skilled man that the same system could be used in any near field RF communicator capable of detecting load modulation and has particular advantages where space is a premium, for example in a host device or where the housing or package of a stand-alone near field RF communicator has to be small because of the application for which it is to be used.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A communications device, comprising:
    a coupling connection configured to receive a communication signal from another communications device, the communication signal causing an output current at the coupling connection to fluctuate;
    a driver configured to adjust the output current to substantially compensate for the fluctuations of the output current to maintain a substantially constant voltage at the coupling connection;
    a demodulator configured to extract modulation from a supply current, the supply current providing operational power to the driver and fluctuating in a substantially similar manner as the output current; and
    a controller configured to control the driver to maintain the substantially constant voltage.

2. The communications device of claim 1, wherein the driver is further configured to:
    maintain the substantially constant voltage so that the fluctuations of the output current do not substantially vary the substantially constant voltage.

3. The communications device of claim 1, wherein the output current is proportional to the substantially constant voltage divided by a sum of an output resistance and a load resistance.

4. The communications device of claim 1, wherein the demodulator is further configured to:
    detect the modulation based on the fluctuations of the supply current as the driver maintains the substantially constant voltage.

5. The communications device of claim 1, wherein the output current is a second communication signal, and
    wherein the coupling connection is further configured to transmit the second communication signal to the other communications device.

6. The communications device of claim 1, wherein the driver is a differential amplifier.

7. The communications device of claim 1, further comprising:
a sense resistor coupled between a power supply providing the supply current and the driver,
wherein the supply current is provided by the power supply through the sense resistor to the driver.

8. The communications device of claim 1, wherein the driver comprises:
a plurality of variable current sources configured to provide the output current to the coupling connection.

9. The communications device of claim 8, wherein the controller is further configured to control the plurality of variable current sources based on a sine synthesis signal.

10. The communications device of claim 1, wherein the demodulator is further configured to detect the modulation based on the fluctuations of the output current at a load resistance.

11. A method, comprising:
receiving, by a communications device, a communication signal from another communications device at a coupling connection, the communication signal causing an output current at the coupling connection to fluctuate;
adjusting, by the communications device, the output current to substantially compensate for the fluctuations of the output current to maintain a substantially constant voltage at the coupling connection;
extracting, by the communications device, modulation from a supply current, the supply current providing operational power to a driver within the communications device and fluctuating in a substantially similar manner as the output current; and
controlling, by the communications device, the output current to maintain the substantially constant voltage.

12. The method of claim 11, wherein the adjusting comprises:
providing the output current proportionally to the substantially constant voltage divided by a sum of an output resistance and a load resistance.

13. The method of claim 11, further comprising:
detecting the modulation based on the fluctuations of the supply current as the substantially constant voltage is maintained.

14. The method of claim 11, wherein the output current is a second communication signal, and further comprising:
transmitting a second communication signal from the coupling connection to the other communications device.

15. The method of claim 11, further comprising:
detecting the modulation based on the fluctuations of the supply current as the communications device maintains the substantially constant voltage.

* * * * *